US012677540B2

(12) United States Patent
Lee

(10) Patent No.: US 12,677,540 B2
(45) Date of Patent: Jul. 7, 2026

(54) DISPLAY DEVICE AND METHOD OF MANUFACTURING THE SAME

(71) Applicant: SAMSUNG DISPLAY CO., LTD.,
Yongin-si (KR)

(72) Inventor: Junhee Lee, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 294 days.

(21) Appl. No.: 18/231,457

(22) Filed: Aug. 8, 2023

(65) Prior Publication Data

US 2024/0172481 A1     May 23, 2024

(30) Foreign Application Priority Data

Nov. 17, 2022     (KR) ........................ 10-2022-0154696

(51) Int. Cl.
| *H10K 59/122* | (2023.01) |
| *H10K 59/12* | (2023.01) |
| *H10K 59/80* | (2023.01) |
| *H10K 71/16* | (2023.01) |

(52) U.S. Cl.
CPC ....... *H10K 59/122* (2023.02); *H10K 59/1201* (2023.02); *H10K 59/873* (2023.02); *H10K 71/166* (2023.02)

(58) Field of Classification Search
CPC ............. H10K 59/122; H10K 59/1201; H10K 59/873; H10K 71/166; H10K 50/15; H10K 50/16; H10K 50/19; H10K 50/81; H10K 50/844; H10K 71/00
See application file for complete search history.

(56) References Cited

U.S. PATENT DOCUMENTS

| 9,299,753 B2 | 3/2016 | Choi |
| 2019/0165062 A1 | 5/2019 | Heo |
| 2020/0235172 A1 | 7/2020 | Lee et al. |
| 2021/0191264 A1 | 6/2021 | Tanigaki et al. |

FOREIGN PATENT DOCUMENTS

| CN | 110993806 A | 4/2020 |
| KR | 101323201 B1 | 10/2013 |
| KR | 1020150135722 | 12/2015 |
| KR | 20190064198 A | 6/2019 |
| KR | 1020200074145 | 6/2020 |
| KR | 20200091059 A | 7/2020 |
| KR | 102294626 | 8/2021 |
| KR | 1020220057626 | 5/2022 |

*Primary Examiner* — Donald L Raleigh
(74) *Attorney, Agent, or Firm* — CANTOR COLBURN LLP

(57)     ABSTRACT

A display device includes a substrate, a pixel electrode disposed on the substrate, a bank layer disposed on the pixel electrode, where the bank layer includes a first portion in which a pixel opening exposing at least a portion of the pixel electrode is defined, where the first portion includes a surface inclined by a first angle with respect to the pixel electrode, a second portion spaced apart from the first portion and including a first surface, a second surface disposed below the first surface to be spaced apart from the first surface, and a third surface connecting the first surface and the second surface to each other, and a third portion connecting the first portion and the second portion to each other.

20 Claims, 9 Drawing Sheets

DISPLAY DEVICE AND METHOD OF MANUFACTURING THE SAME

This application claims priority to Korean Patent Application No. 10-2022-0154696, filed on Nov. 17, 2022, and all the benefits accruing therefrom under 35 U.S.C. § 119, the content of which in its entirety is herein incorporated by reference.

BACKGROUND

1. Field

One or more embodiments relate to a device and a method of manufacturing the device, and more particularly, to a display device and a method of manufacturing the display device.

2. Description of the Related Art

Electronic devices based on mobility, e.g., portable or mobile electronic device, are widely used. As mobile electronic devices, tablet personal computers (PC) have been widely used in recent years, in addition to small electronic devices such as mobile phones.

Such a mobile electronic device may include a display device that provides visual information, such as an image or a video, to a user to support various functions. Recently, as the size of other components for driving a display device has been reduced, the proportion of the display device in an electronic device has gradually increased, and a structure that may be bent to a certain angle from a flat state has been developed.

SUMMARY

One or more embodiments include a display device that may reduce a phenomenon in which electrons or holes generated in a common layer disposed on one pixel electrode move to another pixel electrode by disconnecting a portion of a common layer disposed on a bank layer.

According to one or more embodiments, a display device includes a substrate, a pixel electrode disposed on the substrate, a bank layer disposed on the pixel electrode, where the bank layer includes a first portion in which a pixel opening exposing at least a portion of the pixel electrode is defined, where the first portion includes a surface inclined by a first angle with respect to the pixel electrode, a second portion spaced apart from the first portion and including a first surface, a second surface disposed below the first surface to be spaced apart from the first surface, and a third surface connecting the first surface and the second surface to each other, and a third portion connecting the first portion and the second portion to each other.

In an embodiment, the third surface of the second portion of the bank layer may be inclined by a second angle with respect to the second surface of the second portion of the bank layer.

In an embodiment, the first angle may be less than the second angle.

In an embodiment, the second angle may be about 70 degrees or greater and about 110 degrees or less.

In an embodiment, the first angle may be about 20 degrees of greater and about 40 degrees or less.

In an embodiment, at least a portion of the first surface of the second portion of the bank layer may be disposed above an upper surface of the third portion of the bank layer.

In an embodiment, the first surface of the second portion of the bank layer may include a first first surface connected to the third surface of the second portion of the bank layer to be disposed above the upper surface of the third portion of the bank layer and including a flat surface, and a second first surface connecting the first first surface and the upper surface of the third portion of the bank layer to each other and including a curved surface.

In an embodiment, the display device may further include a common layer disposed on the bank layer, where a common layer disposed on the first surface of the second portion of the bank layer and a common layer disposed on the second surface of the second portion of the bank layer may be spaced apart from each other.

In an embodiment, the display device may further include an encapsulation layer disposed on the common layer, where the encapsulation layer may be in contact with the third surface of the second portion of the bank layer.

In an embodiment, the common layer may include a first common layer, a second common layer disposed on the first common layer, and a third common layer disposed on the second common layer, where the second common layer may include an electron transport layer, an electron generation layer disposed on the electron transport layer, a hole generation layer disposed on the electron generation layer, and a hole transport layer disposed on the hole generation layer.

In an embodiment, the display device may further include a first emission layer overlapping the pixel electrode and disposed between the first common layer and the second common layer, and a second emission layer overlapping the pixel electrode and disposed between the second common layer and the third common layer.

According to one or more embodiments, a method of manufacturing a display device includes disposing a pixel electrode on a substrate, disposing an unprocessed bank layer on the pixel electrode, disposing a first mask on the unprocessed bank, performing a primary processing on the unprocessed bank layer by radiating light onto the first mask to form a primary-processed bank layer, disposing a second mask on the primary-processed bank layer, and performing a secondary processing on the primary-processed bank layer by radiating light onto the second mask to from a secondary-processed bank layer, where the secondary-processed bank layer includes a first portion in which a pixel opening exposing at least a portion of the pixel electrode is defined, where the first portion include a surface inclined by a first angle with respect to the pixel electrode, a second portion spaced apart from the first portion and including a first surface, a second surface disposed below the first surface to be spaced apart from the first surface, and a third surface connecting the first surface and the second surface to each other, and a third portion connecting the first portion and the second portion to each other.

In an embodiment, the first mask may include a first first mask portion which blocks light, a second first mask portion having a light blocking rate of greater than about 0% and less than about 100%, and a third first mask portion defined by an opening portion.

In an embodiment, the primary processing on the unprocessed bank layer may include curing at least a portion of the unprocessed bank layer overlapping the third first mask portion with light passed through the third first mask portion, curing at least a portion of the unprocessed bank layer overlapping the second first mask portion with light passed through the second first mask portion, and removing at least a portion of the unprocessed bank layer to expose at least a portion of the pixel electrode and to form the first surface, the second surface, and the third surface of the second portion of the secondary-processed bank layer.

In an embodiment, the second mask may include a first second mask portion which blocks light, and a second second mask portion defined by an opening portion.

In an embodiment, the secondary processing on the primary-processed bank layer may include curing at least a portion of the primary-processed bank layer overlapping the second second mask portion with light passed through the second second mask portion, and removing at least a portion of the primary-processed bank layer to make the first angle be less than a second angle between the second surface and the third surface of the second portion of the secondary-processed bank layer.

In an embodiment, at least a portion of the first surface may be disposed above an upper surface of the third portion of the secondary-processed bank layer.

In an embodiment, the first surface of the second portion of the secondary-processed bank layer may include a first first surface connected to the third surface of the second portion of the secondary-processed bank layer to be disposed above the upper surface of the third portion of the secondary-processed bank layer and including a flat surface, and a second first surface connecting the first first surface and the upper surface of the third portion of the secondary-processed bank layer to each other and including a curved surface.

In an embodiment, the method may further include providing a common layer on the secondary-processed bank layer, where a common layer disposed on the first surface of the second portion of the secondary-processed bank layer and a common layer disposed on the second surface of the second portion of the secondary-processed bank layer may be spaced apart from each other.

In an embodiment, the method may further include providing an encapsulation layer on the common layer, where the encapsulation layer may be in contact with the third surface.

Features of embodiments other than those described above will now become apparent from the following drawings, claims, and the detailed description of the disclosure.

BRIEF DESCRIPTION OF THE DRAWINGS

The above and other features of certain embodiments of the disclosure will be more apparent from the following description taken in conjunction with the accompanying drawings, in which:

FIG. 2 is a schematic cross-sectional view of a display device taken along line II-II' of FIG. 1, according to an embodiment;

FIGS. 5 to 9 are schematic cross-sectional views illustrating processes of a method of manufacturing of a display device according to an embodiment.

DETAILED DESCRIPTION

Figure 1:
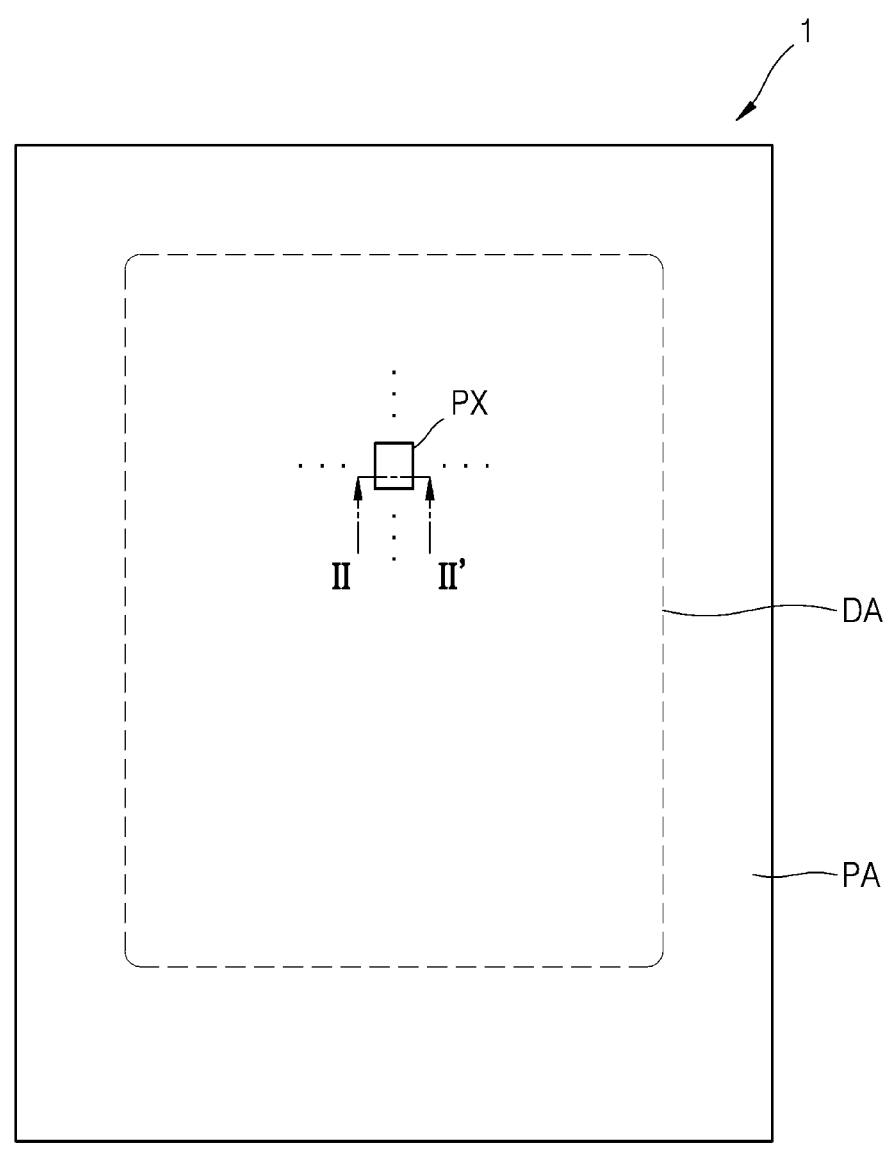
FIG. 1 is a schematic plan view of a display device according to an embodiment.
Figure 1:
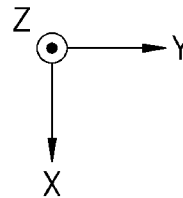

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of components in the drawings may be exaggerated for convenience of illustration. In other words, since sizes and thicknesses of components in the drawings are arbitrarily illustrated for convenience of illustration and description, the following embodiments are not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

The x, y, and z axes are not limited to three axes of an orthogonal coordinates system, and may be interpreted in a broad sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic plan view of a display device 1 according to an embodiment.

Referring to FIG. 1, an embodiment of the display device 1 may include a display area DA and a peripheral area PA outside the display area DA. The display device 1 may provide an image through an array of a plurality of pixels PX, which are two-dimensionally arranged (e.g., in a matrix form) in the display area DA.

The peripheral area PA is an area which does not provide an image, and may entirely or partially surround the display area DA. A driver configured to provide electrical signals or power to a pixel circuit corresponding to each of the plurality of pixels PX or the like may be arranged in the peripheral area PA. A pad, which is an area to which an electronic device or a printed circuit board may be electrically connected, may be arranged in the peripheral area PA.

Hereinafter, for convenience of description, embodiments where the display device 1 includes an organic light-emitting diode (OLED) as a light-emitting element will be described, but the display device 1 is not limited thereto. In an alternative embodiment, the display device 1 may be a light-emitting display device including an inorganic light-emitting diode, that is, an inorganic light-emitting display device. The inorganic light-emitting diode may include a PN junction diode including materials based on inorganic semiconductors. When a voltage is applied to the PN junction diode in a forward direction, holes and electrons may be injected, and energy generated by recombination of the holes and electrons may be converted into light energy to emit a certain color of light. The inorganic light-emitting diode described above may have a width of several micrometers to several hundreds of micrometers, and in some embodiments, the inorganic light-emitting diode may be referred to as a micro light-emitting diode (LED). In another alternative embodiment, the display device 1 may be a quantum dot light-emitting display device.

The display device 1 may be a portable electronic device, such as a mobile phone, a smartphone, a table personal computer (PC), a mobile communication terminal, an electronic notebook, an electronic book, a portable multimedia player (PMP), a navigation device, an ultra mobile PC (UMPC), or the like, and may also be used as a display screen of various products, such as a television, a laptop computer, a monitor, an advertisement board, an Internet of things (IoT) device, or the like. In addition, the display device 1 according to an embodiment may be used as a wearable device, such as a smart watch, a watch phone, a glasses-type display, and a head-mounted display (HMD). In addition, the display device 1 according to an embodiment may be used as a dashboard of a vehicle, a center fascia of a vehicle or a center information display (CID) disposed on a dashboard, a rear-view mirror display replacing a side mirror of a vehicle, and a display screen disposed on a back surface of a front seat as entertainment for a passenger in a back seat of a vehicle.

Figure 2:
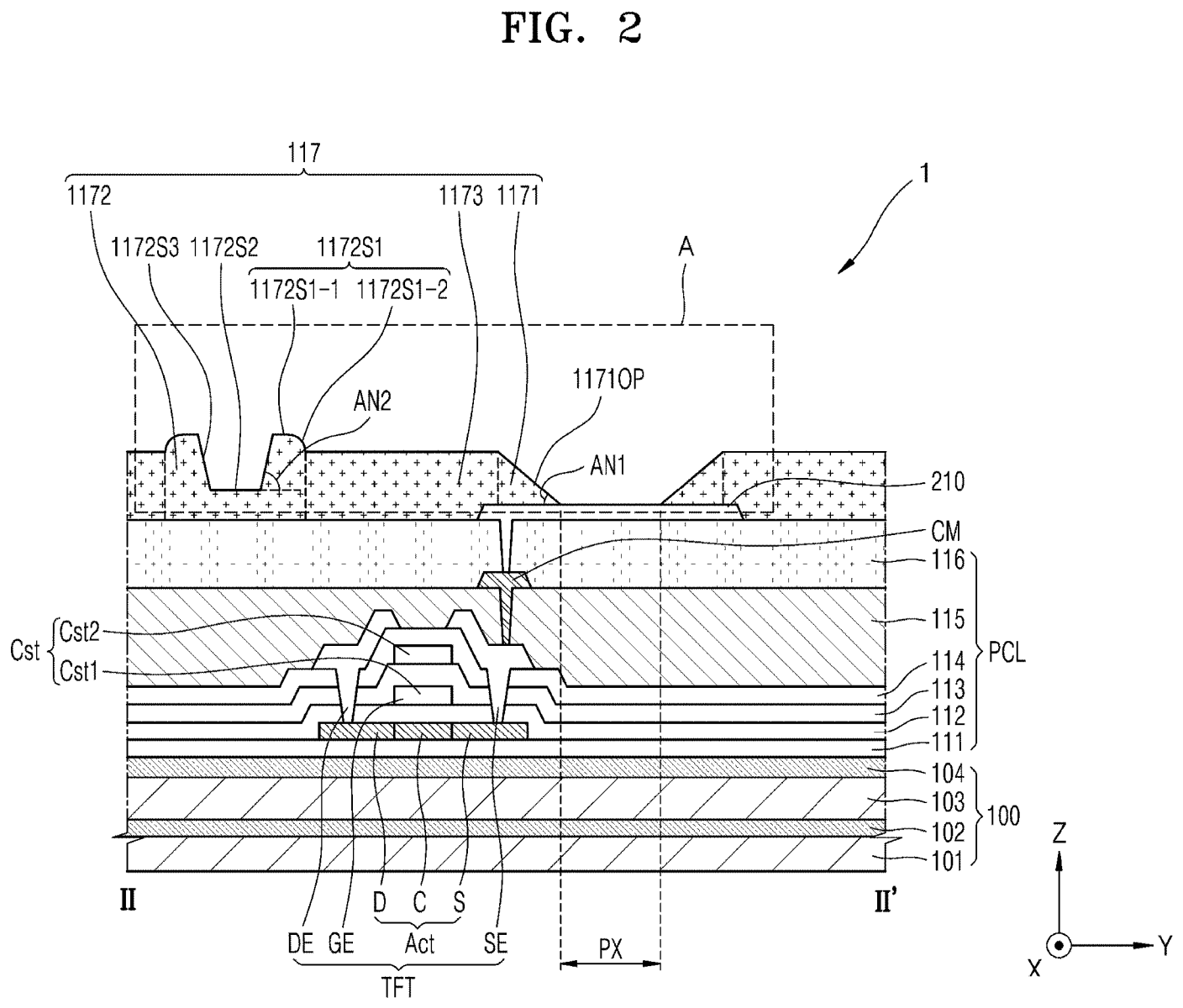
Figure 3:
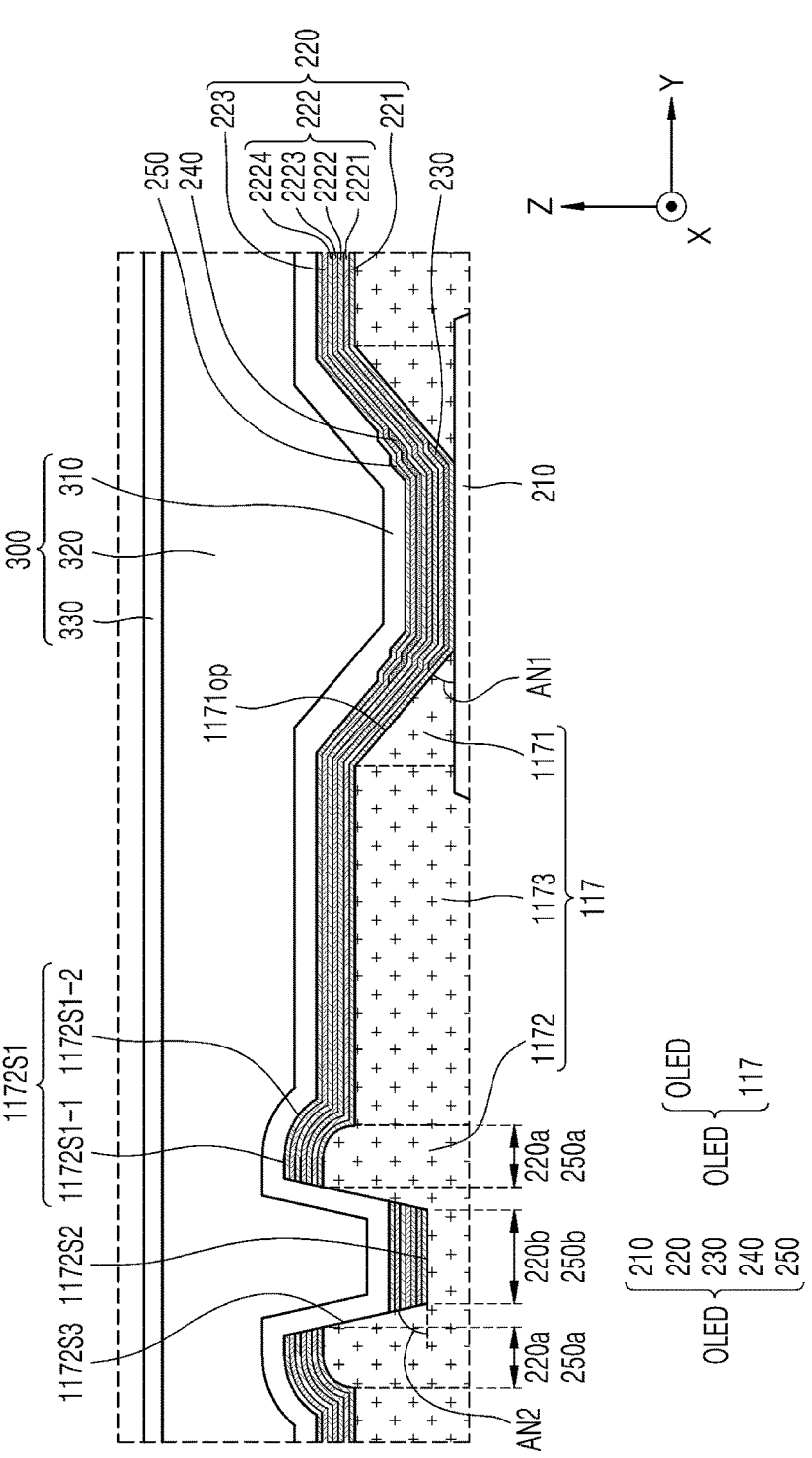
FIG. 3 is a schematic cross-sectional view of a display device according to an embodiment.

FIG. 2 is a schematic cross-sectional view of the display device 1 taken along line II-11' of FIG. 1, according to an embodiment. FIG. 3 is a schematic cross-sectional view of the display device 1 according to an embodiment, which may correspond to a region A of FIG. 2. For convenience of illustration, in FIG. 2, the structure above the bank layer 117 is omitted, and in FIG. 3, some of the components shown in FIG. 2 are omitted.

Referring to FIGS. 2 and 3, an embodiment of the display device 1 may include a stacked structure of a substrate 100, a pixel circuit layer PCL, a display element layer DEL, and an encapsulation layer 300.

The substrate 100 may have a multi-layered structure including a base layer and an inorganic layer, the base layer including a polymer resin. In an embodiment, for example, the substrate 100 may include a base layer including a polymer resin, and a barrier layer defined by an inorganic insulating layer. In an embodiment, for example, the substrate 100 may include a first base layer 101, a first barrier layer 102, a second base layer 103, and a second barrier layer 104, which are sequentially stacked one on another. The first base layer 101 and the second base layer 103 may each include polyimide (PI), polyethersulfone (PES), polyarylate, polyetherimide (PEI), polyethylene naphthalate (PEN), polyethylene terephthalate (PET), polyphenylene sulfide (PPS), polycarbonate, cellulose triacetate (TAC), or/and cellulose acetate propionate (CAP), or the like. The first barrier layer 102 and the second barrier layer 104 may each include an inorganic insulating material, such as silicon oxide, silicon nitride, and/or silicon oxynitride. The substrate 100 may be flexible.

The pixel circuit layer PCL may be disposed on the substrate 100. FIG. 2 illustrates an embodiment where the pixel circuit layer PCL includes a thin-film transistor TFT, a buffer layer 111, a first gate insulating layer 112, a second gate insulating layer 113, an interlayer insulating layer 114, a first planarization insulating layer 115, and a second planarization insulating layer 116. In such an embodiment, the buffer layer 111, the first gate insulating layer 112, the second gate insulating layer 113, the interlayer insulating layer 114, the first planarization insulating layer 115, and the second planarization insulating layer 116 are disposed below or/and above components of the thin-film transistor TFT.

The buffer layer 111 may reduce or block penetration of foreign materials, moisture, or external air from a lower portion of the substrate 100 and may provide a flat surface on the substrate 100. The buffer layer 111 may include an inorganic insulating material, such as silicon oxide, silicon oxynitride, and silicon nitride, and may be defined by a single layer or a multi-layer, each layer therein including at least one selected from the materials stated above.

The thin-film transistor TFT disposed on the buffer layer 111 may include a semiconductor layer Act, and the semiconductor layer Act may include polysilicon (poly-Si). Alternatively, the semiconductor layer Act may include amorphous silicon (a-Si), an oxide semiconductor, an organic semiconductor, or the like. The semiconductor layer Act may include a channel area C, a drain area D, and a source area S, where the drain area D and the source area S are respectively arranged on both sides of the channel area C. A gate electrode GE of the thin-film transistor TFT may overlap the channel area C.

The gate electrode GE may include a low-resistance metal material. The gate electrode GE may include a conductive material including molybdenum (Mo), aluminum (Al), copper (Cu), titanium (Ti), or the like, and may be defined by a multi-layer or a single layer, each layer therein including at least one selected from the materials stated above.

The first gate insulating layer 112 between the semiconductor layer Act and the gate electrode GE may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Zinc oxide ($ZnO_x$) may be zinc oxide (ZnO) and/or zinc peroxide ($ZnO_2$).

The second gate insulating layer 113 may cover the gate electrode GE. Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Zinc oxide ($ZnO_x$) may be zinc oxide (ZnO) and/or zinc peroxide ($ZnO_2$).

An upper electrode Cst2 of a storage capacitor Cst may be disposed on the second gate insulating layer 113. The upper electrode Cst2 may overlap the gate electrode GE therebelow. In such an embodiment, the gate electrode GE and the upper electrode Cst2, which overlap each other with the second gate insulating layer 113 therebetween, may form or collectively define the storage capacitor Cst. That is, the gate electrode GE may function as a lower electrode Cst1 of the storage capacitor Cst.

In such an embodiment, as described above, the storage capacitor Cst and the thin-film transistor TFT may overlap each other. In some embodiments, the storage capacitor Cst may not overlap the thin-film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be defined by a single layer or a multi-layer, each layer therein including at least one selected from the materials stated above.

The interlayer insulating layer 114 may cover the upper electrode Cst2. The interlayer insulating layer 114 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Zinc oxide ($ZnO_x$) may be zinc oxide (ZnO) and/or zinc peroxide ($ZnO_2$). The interlayer insulating layer 114 may be defined by a single layer or a multi-layer, each layer therein including at least one selected from the inorganic insulating materials stated above.

Each of a drain electrode DE and a source electrode SE of the thin-film transistor TFT may be disposed on the interlayer insulating layer 114. The drain electrode DE and the source electrode SE may respectively be connected to the drain area D and the source area S through contact holes defined or formed in insulating layers below the drain electrode DE and the source electrode SE. The drain electrode DE and the source electrode SE may each include a material having high conductivity. The drain electrode DE and the source electrode SE may each include a conductive material including Mo, Al, Cu, Ti, or the like, and may be defined by a multi-layer or a single layer, each layer therein including at least one selected from the above materials. In an embodiment, the drain electrode DE and the source electrode SE may each have a multi-layered structure of Ti/Al/Ti.

The first planarization insulating layer 115 may cover the drain electrode DE and the source electrode SE. The first planarization insulating layer 115 may include a general commercial polymer, such as poly(methyl methacrylate) (PMMA) or polystyrene (PS), a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, or a mixture thereof.

The second planarization insulating layer 116 may be disposed on the first planarization insulating layer 115. The second planarization insulating layer 116 may include a same material as that of the first planarization insulating layer 115, and may include a general commercial polymer, such as PMMA or PS, a polymer derivative having a phenol group, and an organic insulating material, such as an acrylic polymer, an imide polymer, an aryl ether polymer, an amide polymer, a fluorine polymer, a p-xylene polymer, a vinyl alcohol polymer, or a mixture thereof.

The display element layer may be disposed on the pixel circuit layer PCL having the structure described above. The display element layer may include an organic light-emitting diode OLED as a display element (i.e., a light-emitting element) and a bank layer 117, and the organic light-emitting diode OLED may include a pixel electrode 210, a common layer 220, a first emission layer 230, a second emission layer 240, and a common electrode 250.

The organic light-emitting diode OLED may emit, for example, red, green, or blue light, or may emit red, green, blue, or white light. The organic light-emitting diode OLED may emit light through an emission area, and define the emission area as a pixel PX.

The pixel electrode 210 may be disposed above the substrate 100. The pixel electrode 210 may be electrically connected to the thin-film transistor TFT through contact holes defined or formed in the second planarization insulating layer 116 and the first planarization insulating layer 115 and a connection metal CM disposed on the first planarization insulating layer 115.

In an embodiment, the pixel electrode 210 may include a conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). In an alternative embodiment, the pixel electrode 210 may include a reflective film including Ag, Mg, Al, Pt, Pd, Au, Ni, Nd, Ir, Cr, or a compound thereof. In another alternative embodiment, the pixel electrode 210 may further include a film including ITO, IZO, ZnO, or In$_2$O$_3$ above/below the reflective film described above.

The bank layer 117 may be disposed on the pixel electrode 210. The bank layer 117 may be in contact with the pixel electrode 210 and the second planarization insulating layer 116. In an embodiment, a pixel opening 1171OP exposing at least a portion of the pixel electrode 210 may be defined through the bank layer 117.

The bank layer 117 may include an organic insulating material and/or an inorganic insulating material. The pixel opening 1171OP may define an emission area of light emitted from the organic light-emitting diode OLED. In an embodiment, for example, the size/width of the pixel opening 1171OP may correspond to the size/width of the emission area. Accordingly, the size and/or width of the pixel PX may depend on the size and/or width of the pixel opening 1171OP.

The bank layer 117 may include a light-blocking material. The light-blocking material may include carbon black, carbon nanotubes, a resin or paste including a black dye, metal particles (e.g., nickel, aluminum, molybdenum, and alloys thereof), metal oxide particles (e.g., chromium oxide), metal nitride particles (e.g., chromium nitride), or the like. Reflection of external light by metal structures disposed below the bank layer 117 may be reduced by arranging the bank layer 117 including the light-blocking material.

In an embodiment, as shown in FIG. 3, the common layer 220 may include a first common layer 221, a second common layer 222 disposed on the first common layer 221, and a third common layer 223 disposed on the second common layer 222. The second common layer 222 may include an electron transport layer 2221, an electron generation layer 2222 disposed on the electron transport layer 2221, a hole generation layer 2223 disposed on the electron generation layer 2222, and a hole transport layer 2224 disposed on the hole generation layer 2223. That is, the first common layer 221, the electron transport layer 2221, the electron generation layer 2222, the hole generation layer 2223, and the hole transport layer 2224, and the third common layer 223 may be sequentially arranged in a direction away from the pixel electrode 210.

The first emission layer 230 may be between the first common layer 221 and the second common layer 222. That is, the first emission layer 230 may be in contact with the first common layer 221 and the electron transport 2221. Also, the second emission layer 240 may be between the second common layer 222 and the third common layer 223. That is, the second emission layer 240 may be in contact with the hole transport layer 2224 and the third common layer 223. The first emission layer 230 and the second emission layer 240 may be arranged in the pixel opening 1171OP to overlap the pixel electrode 210.

The first common layer 221 may be, for example, a hole injection layer (HIL) or a hole transport layer (HTL), or may have a structure in which an HIL and an HTL are stacked.

The third common layer 223 may be, for example, an electron injection layer (EIL) or an electron transport layer (ETL), or may have a structure in which an EIL and an ETL are stacked.

The second common layer 222 may have a multi-layered structure. FIG. 3 illustrates an embodiment where the second common layer 222 includes the electron transport layer 2221, the electron generation layer 2222, the hole generation layer 2223, and the hole transport layer 2224. In addition, an EIL may be further provided between the electron transport layer 2221 and the electron generation layer 2222, and an HIL may be further provided between the hole generation layer 2223 and the hole transport layer 2224.

The first emission layer 230 and the second emission layer 240 may each include a polymer organic material or a low-molecular-weight organic material, which emits light of a certain color. Alternatively, the first emission layer 230 and the second emission layer 240 may each include an inorganic light-emitting material or a quantum dot. The electron generation layer 2222 generates electrons and supplies the generated electrons to the first emission layer 230, so that light emission may occur in the first emission layer 230 receiving holes from the pixel electrode 210. Also, the hole generation layer 2223 generates holes and supplies the generated holes to the second emission layer 240, so that light emission may occur in the second emission layer 240 receiving electrons from the common electrode 250.

The second emission layer 240 may emit light belonging to the same wavelength band as light emitted by the first emission layer 230. In an embodiment, for example, the first emission layer 230 and the second emission layer 240 may emit blue light. As light is emitted by the first emission layer 230 and the second emission layer 240 on the pixel electrode 210, the pixel PX may emit light with high brightness.

The common electrode 250 may be disposed on the third common layer 223 and overlap the pixel electrode 210. The common electrode 250 may include a conductive material having a low work function. In an embodiment, for example, the common electrode 250 may include a (semi)transparent layer including Ag, Mg, Al, Pt, Pd, Au, Ni, Nd, Ir, Cr, lithium (Li), Ca, an alloy thereof, or the like. Alternatively, the common electrode 250 may further include a layer, such as ITO, IZO, ZnO, or In$_2$O$_3$, above the (semi)transparent layer including the materials stated above. The common electrode 250 may be integrally formed to entirely cover (or cover an entire upper surface of) the substrate 100.

The encapsulation layer 300 may be disposed on the display element layer and cover the display element layer. The encapsulation layer 300 may be disposed on the common layer 220 and be in contact with the common electrode 250. The encapsulation layer 300 may include at least one inorganic encapsulation layer and at least one organic encapsulation layer. In an embodiment, as shown in FIG. 3, the encapsulation layer 300 includes a first inorganic encapsulation layer 310, an organic encapsulation layer 320, and a second inorganic encapsulation layer 330, which are sequentially stacked one on another.

The first inorganic encapsulation layer 310 and the second inorganic encapsulation layer 330 may each include at least one inorganic material selected from aluminum oxide, titanium oxide, tantalum oxide, hafnium oxide, zinc oxide, silicon oxide, silicon nitride, or silicon oxynitride. The organic encapsulation layer 320 may include a polymer-based material. The polymer-based material may include an acrylic resin, an epoxy resin, polyimide, polyethylene, or the like. In an embodiment, for example, the organic encapsulation layer 320 may include acrylate. The organic encapsulation layer 320 may be formed by curing a monomer or coating a polymer. The organic encapsulation layer 320 may have transparency.

Although not shown in FIG. 3, a touch sensor layer may be disposed on the encapsulation layer 300, and an optical functional layer may be disposed on the touch sensor layer. The touch sensor layer may obtain coordinate information according to an external input, for example, a touch event. The optical functional layer may reduce the reflectance of light (external light) incident from the outside toward the display device, and/or improve color purity of light emitted by the display apparatus. In an embodiment, the optical functional layer may include a retarder and/or a polarizer. The retarder may be a film type or a liquid-crystal coating type, and may include a λ/2 retarder and/or a λ/4 retarder. The polarizer may also be a film type or a liquid-crystal coating type. The film-type polarizer may include a stretch-type synthetic resin film, and the liquid-crystal-coating-type polarizer may include liquid crystals in a certain arrangement. The retarder and the polarizer may further include a protective film.

An adhesive member may be arranged between the touch sensor layer and the optical functional layer. In an embodiment, a general adhesive member known in the related art may be employed as the adhesive member without limitation. The adhesive member may be a pressure sensitive adhesive (PSA), for example.

The bank layer 117 may include a first portion 1171, a second portion 1172, and a third portion 1173.

The first portion 1171 may overlap the pixel electrode 210 and define the pixel opening 1171OP. The first portion 1171 may include a surface inclined by a first angle AN1 with respect to the pixel electrode 210. That is, an angle between an upper surface of the pixel electrode 210 and an upper surface of the first portion 1171 may be the first angle AN1. A lower surface of the first portion 1171 may be in contact with the upper surface of the pixel electrode 210. In the cross-sectional views of FIGS. 2 and 3, the first portion 1171 may have symmetrical shape around a first axis (e.g., an axis parallel to a Z axis).

The second portion 1172 may be arranged to be spaced apart from the first portion 1171. A lower surface of the second portion 1172 may be in contact with the pixel circuit layer PCL. The second portion 1172 may include a first surface 1172S1, a second surface 1172S2, and a third surface 1172S3, which do not contact the pixel circuit layer PCL. The second surface 1172S2 may be disposed below the first surface 1172S1 to be spaced apart from the first surface 1172S1. The third surface 1172S3 may connect the first surface 1172S1 and the second surface 1172S2 to each other. In such a structure, the second portion 1172 may include a groove shape recessed from an upper surface thereof. In the cross-sectional views of FIGS. 2 and 3, the second portion 1172 may have a symmetrical shape about a second axis. The second surface 1172S2 may include a flat surface parallel to an upper surface of the pixel circuit layer PCL, and the third surface 1172S3 may be inclined by a second angle AN2 with respect to the second surface 1172S2.

The third portion 1173 may be between the first portion 1171 and the second portion 1172, and may connect the first portion 1171 and the second portion 1172 to each other. The first portion 1171, the second portion 1172, and the third portion 1173 may be integrally formed with each other as a single unitary and indivisible part. A lower surface of the third portion 1173, which is adjacent to the first portion 1171, may be in contact with the upper surface of the pixel electrode 210, and a lower surface of the third portion 1173, which is adjacent to the second portion 1172, may be in contact with the upper surface of the pixel circuit layer PCL.

At least a portion of the first surface 1172S1 of the second portion 1172 may be disposed above than the upper surface of the third portion 1173. The first surface 1172S1 may include a first first surface 1172S1-1 and a second first surface 1172S1-2.

The first first surface 1172S1-1 may be connected to the third surface 1172S3 to be disposed above the upper surface of the third portion 1173. The first first surface 1172S1-1 may include a flat surface parallel to the upper surface of the pixel circuit layer PCL. The second first surface 1172S1-2 may connect the first first surface 1172S1-1 and the upper surface of the third portion 1173 to each other. The second first surface 1172S1-2 may include a convex curved surface.

The first angle AN1 of the first portion 1171 may be less than the second angle AN2 of the second portion 1172. In an embodiment, for example, the first angle AN1 may be about 20 degrees or greater and about 40 degrees or less, and the second angle AN2 may be about 70 degrees or greater and about 110 degrees or less. However, this is merely an example, and the ranges of the first angle AN1 and the second angle AN2 are not limited thereto.

Because the first angle AN1 is less than a designated value, in a process of depositing the common layer 220 and the common electrode 250, the common layer 220 and the common electrode 250, which are disposed on the pixel electrode 210 and the first portion 1171, may be continuously disposed without being disconnected. That is, the entire upper surface of the first portion 1171 may be in contact with the lower surface of the common layer 220.

Because the second angle AN2 is greater than the designated value, in the process of depositing the common layer 220, the common layer 220 disposed on the second portion 1172 may have portions disconnected from each other, with the third surface 117253 as a boundary. That is, the common layer 220 disposed on the second portion 1172 may be discontinuously arranged. A portion of the common layer 220a disposed on the first surface 1172S1 may be spaced apart from a portion of the common layer 220b disposed on the second surface 1172S2. At least a portion of the third surface 117253 may not be in contact with the common layer 220.

Also, in a process of depositing the common electrode 250, the common electrode 250 disposed on the second portion 1172 may also be arranged to be disconnected with the third surface 1172S3 as a boundary. That is, the common electrode 250 disposed on the second portion 1172 may be discontinuously arranged. A portion of the common electrode 250a disposed on the first surface 117251 may be spaced apart from a portion of the common electrode 250b disposed on the second surface 117252. At least a portion of the third surface 117253 may not be in contact with the common electrode 250.

In such a structure, the encapsulation layer 300 may be in contact with the third surface 1172S3. In the second portion 1172, the first inorganic encapsulation layer 310 may be in contact with the upper surface of the common electrode 250 and the third surface 1172S3. Accordingly, the encapsulation layer 300 may block or insulate the portion of the common layer 220a disposed on the first surface 1172S1 and the portion of the common layer 220b disposed on the second surface 1172S2 from each other. Also, the encapsulation layer 300 may block or insulate the portion of the common electrode 250a disposed on the first surface 1172S1 and the portion of the common electrode 250b disposed on the second surface 1172S2 from each other.

Because the common layer 220 is disconnected at the second portion 1172, a phenomenon in which electrons or holes generated in the common layer 220 disposed on one pixel electrode 210 move onto another pixel electrode 210 may be reduced. That is, a lateral leakage current phenomenon may be reduced.

Figure 4:
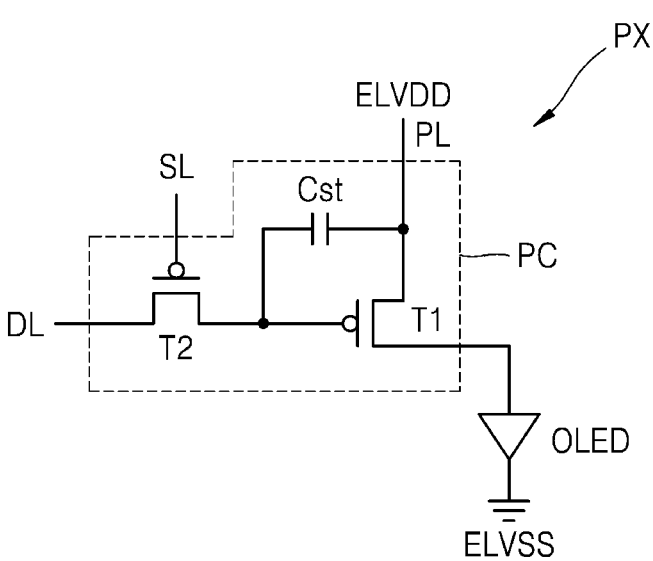
FIG. 4 is an equivalent circuit diagram of a pixel of a display panel according to an embodiment.

FIG. 4 is an equivalent circuit diagram of the pixel PX of a display panel according to an embodiment.

Each pixel PC may include a pixel circuit PC and a display element connected to the pixel circuit PC, for example, an organic light-emitting diode OLED. The pixel circuit PC may include a first thin-film transistor T1, a second thin-film transistor T2, and a storage capacitor Cst. Each pixel PX may emit, for example, red, green, blue, or white light through the organic light-emitting diode OLED.

The second thin-film transistor T2 is a switching thin-film transistor, which may be connected to a scan line SL and a data line DL and be configured to transmit a data voltage, which is input from the data line DL based on a switching voltage input from the scan line SL, to the first thin-film transistor T1. The storage capacitor Cst may be connected to the second thin-film transistor T2 and a driving voltage line PL and store a voltage corresponding to a difference between a voltage received from the second thin-film transistor T2 and a first power supply voltage ELVDD supplied to the driving voltage line PL.

The first thin-film transistor T1 is a driving thin-film transistor, which may be connected to the driving voltage line PL and the storage capacitor Cst and control a driving current flowing from the driving voltage line PL through the organic light-emitting diode OLED based on a voltage value stored in the storage capacitor Cst. The organic light-emitting diode OLED may emit light having a certain brightness corresponding to the driving current. An opposite electrode (e.g., a cathode) of the organic light-emitting diode OLED may receive a second power supply voltage ELVSS.

FIG. 4 illustrates an embodiment where the pixel circuit PC includes two thin-film transistors and one storage capacitor, but the disclosure is not limited thereto. The number of thin-film transistors and the number of storage capacitors may be variously changed according to the design of the pixel circuit PC. In an embodiment, for example, the pixel circuit PC may further include four or more thin-film transistors in addition to the above-mentioned two thin-film transistors.

FIGS. 5 to 9 are schematic cross-sectional views illustrating processes of a method of manufacturing the display device 1 according to an embodiment.

Referring to FIGS. 5 to 9, the display device 1 may be manufactured with a simplified process. In FIGS. 5 to 9, the same reference numerals as those in FIGS. 2 and 3 refer to the same members, and any repetitive detailed descriptions thereof are omitted. The bank layer 117, which has undergone secondary processing, in FIGS. 5 to 9, may correspond to the bank layer 117 described with reference to FIGS. 2 and 3.

Figure 5:
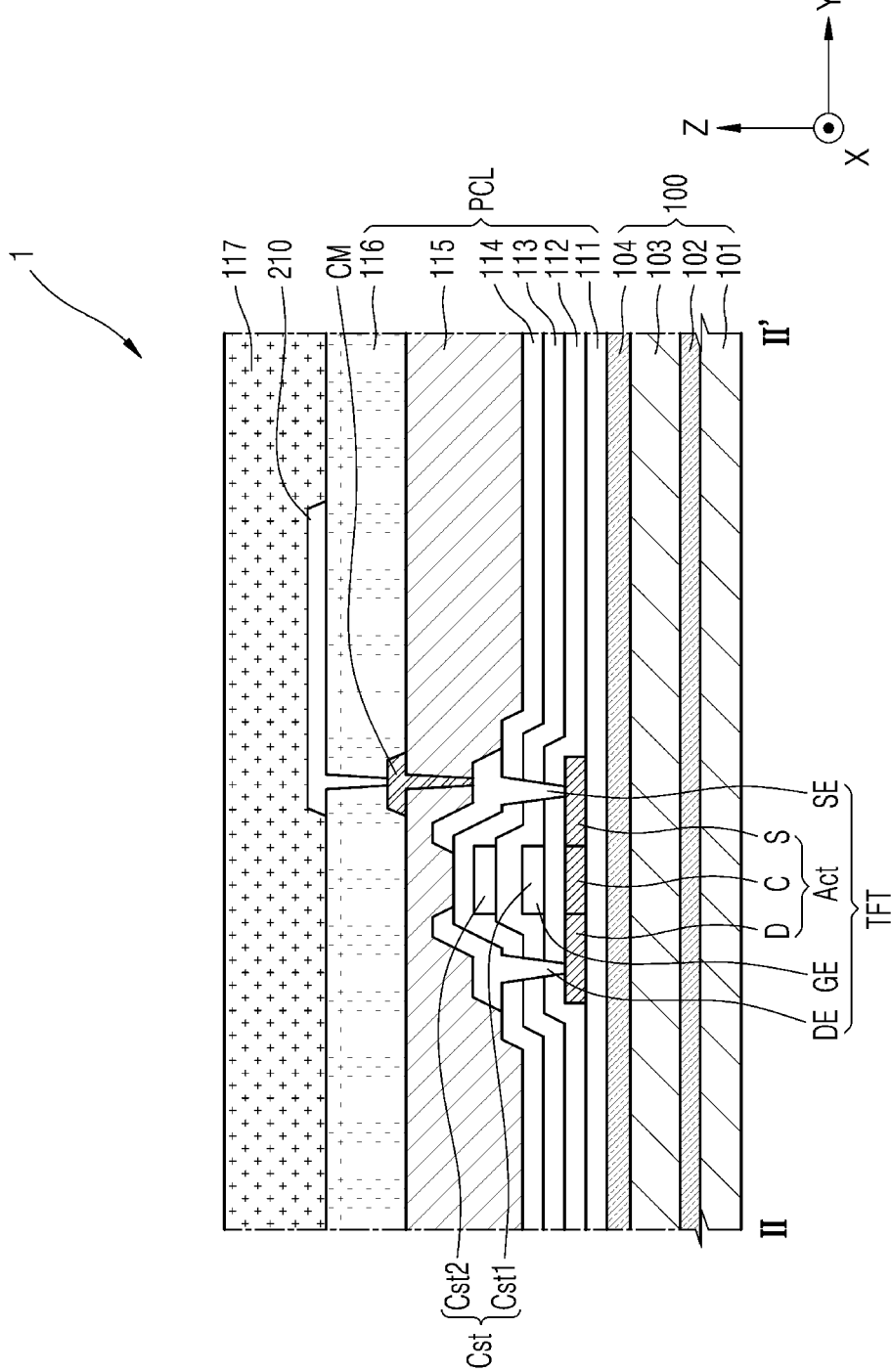

Referring to FIG. 5, a method of manufacturing the display device 1 may include providing the pixel electrode 210 on the substrate 100, and providing the bank layer 117, which is unprocessed, that is, an unprocessed bank layer, on the pixel electrode 210. In an embodiment, the method may further include providing the pixel circuit layer PCL on the substrate 100, where the pixel electrode 210 may be provided on the pixel circuit layer PCL. The unprocessed bank layer 117, which is unprocessed, may be a photoresist layer cured by reacting with light.

Figure 6:
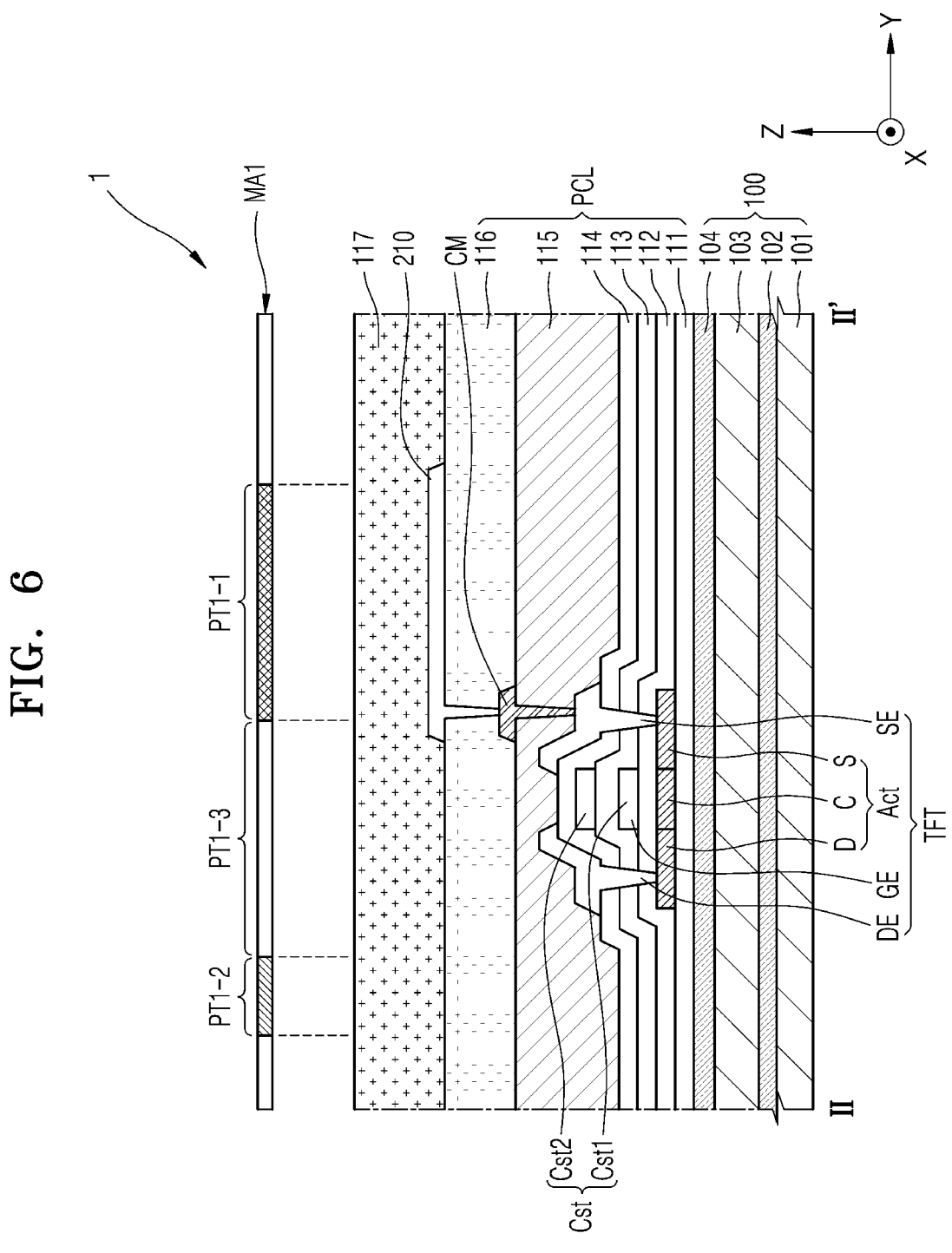
Figure 7:
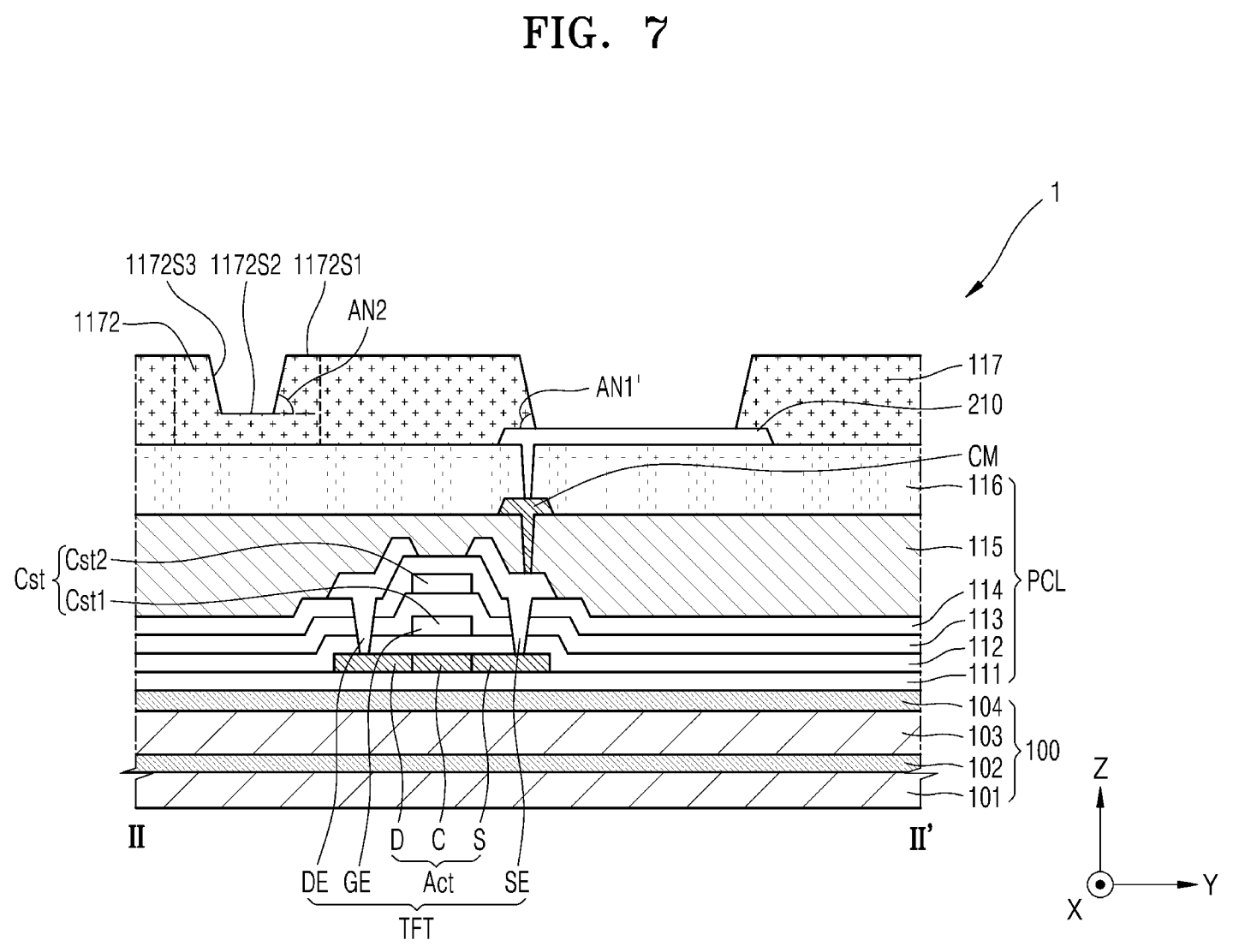

Referring to FIGS. 6 and 7, the method of manufacturing the display device 1 may further include disposing a first mask MA1 on the unprocessed bank layer 117, which is unprocessed, and performing a primary processing on the unprocessed bank layer 117 by radiating light onto the first mask MA1. FIG. 6 is a view illustrating a state in which the first mask MA1 is disposed on the unprocessed bank layer 117, which is unprocessed, and FIG. 7 is a view illustrating a state in which the primary processing on the unprocessed bank layer 117 is completed.

The first mask MA1 may include a first first mask portion PT1-1 that blocks light, a second first mask portion PT1-2 having a light blocking rate of greater than about 0% and less than about 100%, and a third first mask portion PT1-3 defined by an opening portion. That is, the first first mask portion PT1-1 may have a light blocking rate of about 100%, the third first mask portion PT1-3 may have a light blocking rate of about 0%, and the second first mask portion PT1-2 may have a light blocking rate that is lower than the light blocking rate of the first first mask portion PT1-1 and greater than the light blocking rate of the third first mask portion PT1-3. The first first mask portion PT1-1 may be arranged to overlap the pixel electrode 210, the second first mask portion PT1-2 may be arranged to be spaced apart from the first first mask portion PT1-1, and the third first mask portion PT1-3 may be arranged between the first first mask portion PT1-1 and the second first mask portion PT1-2.

The primary processing on the unprocessed bank layer 117 may include curing at least a portion of the unprocessed bank layer 117, the at least a portion overlapping the second first mask portion PT1-2, with light passed through the second first mask portion PT1-2, and curing at least a portion of the unprocessed bank layer 117, the at least a portion overlapping the third first mask portion PT1-3, with light passed through the third first mask portion PT1-3. In such a process, at least a portion of the bank layer 117, which is unprocessed, the at least a portion overlapping the first first mask portion PT1-1, may not be cured. Also, a degree to which at least a portion of the bank layer 117, which is unprocessed, the at least a portion overlapping the second first mask portion PT1-2, is cured may be less than a degree to which at least a portion of the bank layer 117, which is unprocessed, the at least a portion overlapping the third first mask portion PT1-3, is cured.

The primary processing on the unprocessed bank layer 117 may further include removing at least a portion of the unprocessed bank layer 117. In such a process, at least a portion of the unprocessed bank layer 117, which is not cured or has a low degree of curing, may be removed. That is, at least a portion of the unprocessed bank layer 117, which overlaps the first first mask portion PT1-1, and at least a portion of the unprocessed bank layer 117, which overlaps the second first mask portion PT1-2, may be removed.

At least a portion of the pixel electrode 210 may be exposed by removing at least a portion of the unprocessed bank layer 117, which is not cured by overlapping the first first mask portion PT1-1. Also, the first surface 1172S1, the second surface 1172S2, and the third surface 1172S3 may be formed by removing at least a portion of the unprocessed bank layer 117, which has a low degree of curing by overlapping the second first mask portion PT1-2.

At this time, at least a portion of the bank layer 117, which is disposed on the pixel electrode 210 and primary processed, may be inclined by a first' angle AN1' with respect to the pixel electrode 210. Also, the third surface 1172S3 may be inclined by the second angle AN2 with respect to the second surface 1172S2.

Figure 8:
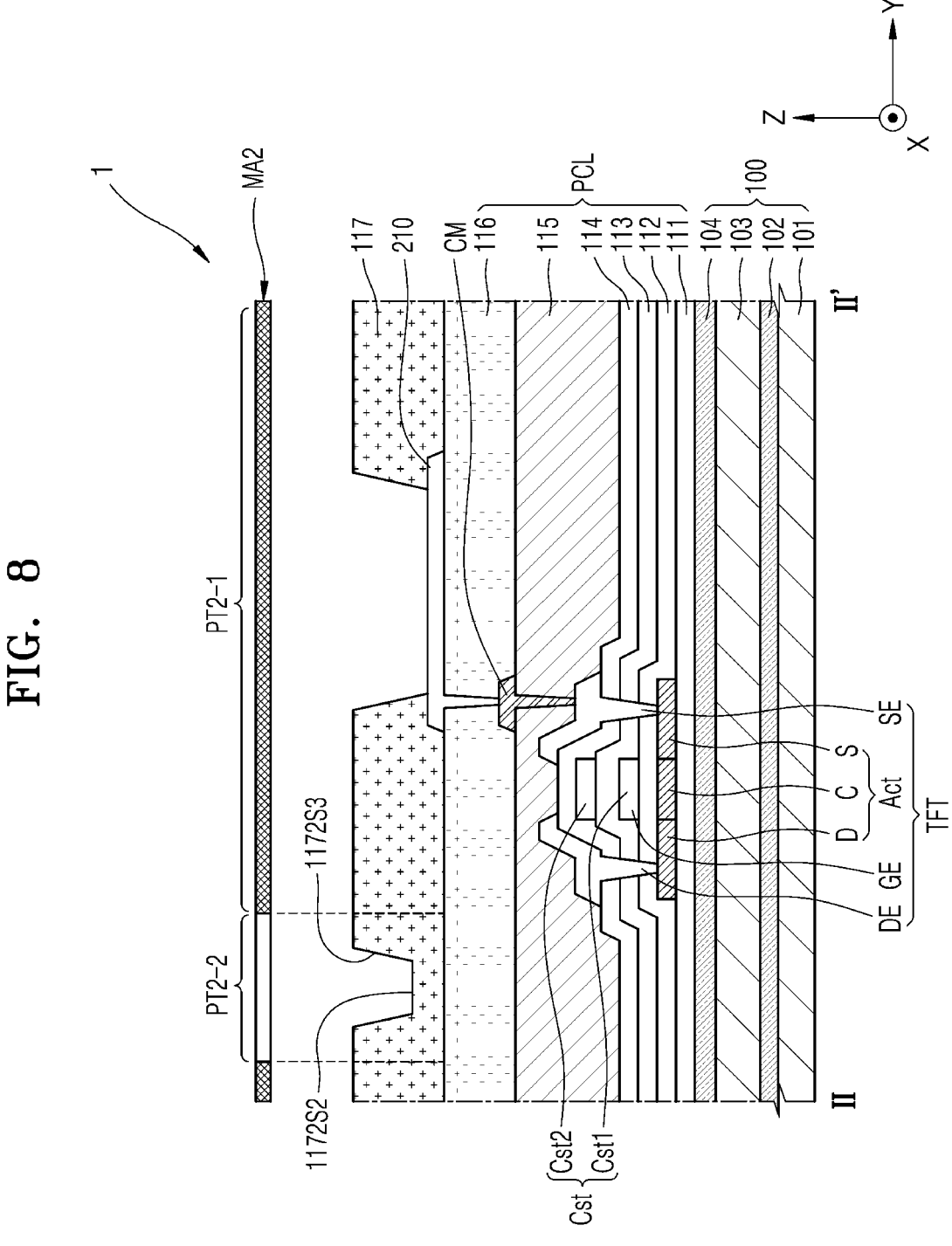
Figure 9:
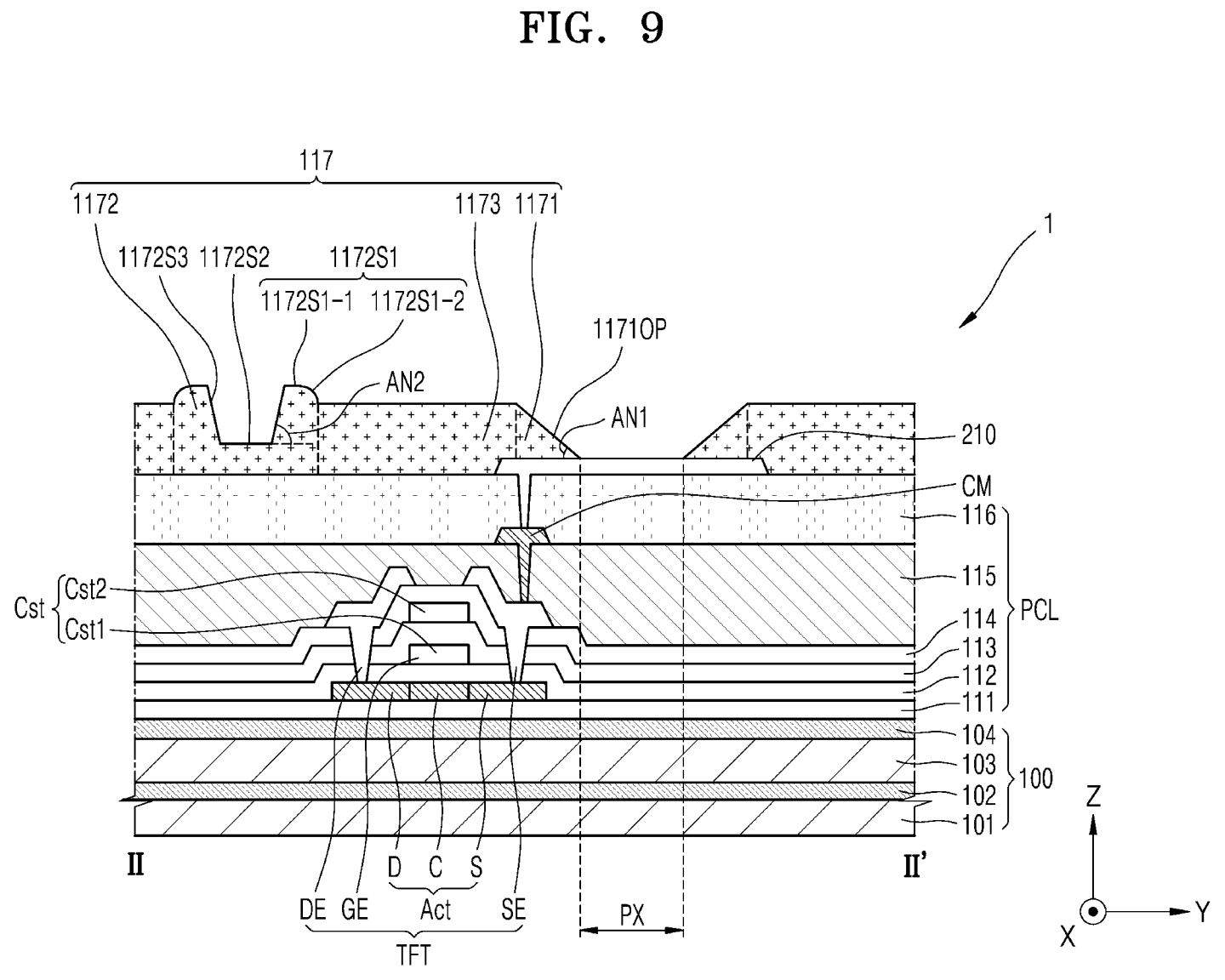

Referring to FIGS. 8 and 9, the method of manufacturing the display device 1 may further include disposing a second mask MA2 on the primary-processed bank layer 117, and performing a secondary processing on the primary-processed bank layer 117 by radiating light onto the second mask MA2. FIG. 8 is a view illustrating a state in which the second mask MA2 is disposed on the primary-processed bank layer 117, and FIG. 9 is a view illustrating a state in which the secondary processing on the primary-processed bank layer 117 is completed.

The second mask MA2 may include a first second mask portion PT2-1 that blocks light, and a second second mask portion PT2-2 defined by an opening portion. That is, the first second mask portion PT2-1 may have a light blocking rate of about 100%, and the second second mask portion PT2-2 may have a light blocking rate of about 0%. The second second mask portion PT2-2 may be arranged to overlap the second surface 1172S2 and the third surface 1172S3, and the first second mask portion PT2-1 may be arranged to overlap the pixel electrode 210.

The secondary processing on the primary-processed bank layer 117 may include curing at least a portion of the primary-processed bank layer 117 overlapping the second second mask portion PT2-2 with light passed through the second second mask portion PT2-2. In such a process, at least a portion of the primary-processed bank layer 117 overlapping the second second mask portion PT2-2 may be cured once more. Also, at least a portion of the primary-processed bank layer 117 overlapping the first second mask portion PT2-1 may not be cured.

The secondary processing on the primary-processed bank layer 117 may further include removing at least a portion of the primary-processed bank layer 117. In such a process, at least a portion of the primary-processed bank layer 117, which is cured or has a low degree of curing, may be removed. A height of the upper surface of the primary-processed bank layer 117 overlapping the first second mask portion PT2-1 may be lowered. That is, at least a portion of the first surface 1172S1 may be disposed above the upper surface of the third portion 1173.

At least a portion of the secondary-processed bank layer 117, which is disposed on the pixel electrode 210, may include a surface inclined by the first angle AN1 with respect to the pixel electrode 210. In the removing of the at least a portion of the primary-processed bank layer 117, at least a portion of the primary-processed bank layer 117, which overlaps the pixel electrode 210, may flow down, and an area in which the secondary-processed bank layer 117 and the pixel electrode 210 contact each other may increase. That is, the first angle AN1 may be less than the first' angle AN1'.

In the removing of the at least a portion of the primary-processed bank layer 117, the shapes of the first first surface 1172S1-1, the second surface 1172S2, and the third surface 1172S3, which overlap the second second mask portion PT2-2 and have a high degree of curing, may not be deformed. That is, the second angle AN2 described with reference to FIGS. 6 and 7 may be maintained. However, the second first surface 1172S1-2 may include a curved surface while at least a portion of the primary-processed bank layer 117, which overlaps the first second mask portion PT2-1 and has a low degree of curing, is removed.

According to embodiments, the quality of a display device may be improved by reducing lateral leakage current occurring on a bank layer.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate;
a pixel electrode disposed on the substrate; and
a bank layer disposed on the pixel electrode,
wherein the bank layer comprises:
    a first portion in which a pixel opening exposing at least a portion of the pixel electrode is defined, wherein the first portion comprises a surface inclined by a first angle with respect to the pixel electrode;
    a second portion spaced apart from the first portion and comprising a first surface, a second surface disposed below the first surface to be spaced apart from the first surface, and a third surface connecting the first surface and the second surface to each other; and
    a third portion connecting the first portion and the second portion to each other.

2. The display device of claim 1, wherein the third surface of the second portion of the bank layer is inclined by a second angle with respect to the second surface of the second portion of the bank layer.

3. The display device of claim 2, wherein the first angle is less than the second angle.

4. The display device of claim 3, wherein the second angle is about 70 degrees or greater and about 110 degrees or less.

5. The display device of claim 1, wherein the first angle is about 20 degrees of greater and about 40 degrees or less.

6. The display device of claim 1, wherein at least a portion of the first surface of the second portion of the bank layer is disposed above an upper surface of the third portion of the bank layer.

7. The display device of claim 6, wherein the first surface of the second portion of the bank layer comprises:
a first first surface connected to the third surface of the second portion of the bank layer to be disposed above the upper surface of the third portion of the bank layer and comprising a flat surface; and
a second first surface connecting the first first surface and the upper surface of the third portion of the bank layer to each other and comprising a curved surface.

8. The display device of claim 1, further comprising:
a common layer disposed on the bank layer,
wherein a common layer disposed on the first surface of the second portion of the bank layer and a common layer disposed on the second surface of the second portion of the bank layer are spaced apart from each other.

9. The display device of claim 8, further comprising:

an encapsulation layer disposed on the common layer, wherein the encapsulation layer is in contact with the third surface of the second portion of the bank layer.

10. The display device of claim 8, wherein the common layer comprises:

a first common layer;

a second common layer disposed on the first common layer; and a third common layer disposed on the second common layer, wherein the second common layer comprises:

an electron transport layer;

an electron generation layer disposed on the electron transport layer;

a hole generation layer disposed on the electron generation layer; and a hole transport layer disposed on the hole generation layer.

11. The display device of claim 10, further comprising:

a first emission layer overlapping the pixel electrode and disposed between the first common layer and the second common layer; and a second emission layer overlapping the pixel electrode and disposed between the second common layer and the third common layer.

12. A method of manufacturing a display device, the method comprising:

disposing a pixel electrode on a substrate;

disposing an unprocessed bank layer on the pixel electrode;

disposing a first mask on the unprocessed bank layer;

performing a primary processing on the unprocessed bank layer by radiating light onto the first mask to form a primary-processed bank layer;

disposing a second mask on the primary-processed bank layer; and performing a secondary processing on the primary-processed bank layer by radiating light onto the second mask to from a secondary-processed bank layer, wherein the secondary-processed bank layer comprises:

a first portion in which a pixel opening exposing at least a portion of the pixel electrode is defined, wherein the first portion comprises a surface inclined by a first angle with respect to the pixel electrode;

a second portion spaced apart from the first portion and comprising a first surface, a second surface disposed below the first surface to be spaced apart from the first surface, and a third surface connecting the first surface and the second surface to each other; and a third portion connecting the first portion and the second portion to each other.

13. The method of claim 12, wherein the first mask comprises:

a first first mask portion which blocks light;

a second first mask portion having a light blocking rate of greater than about 0% and less than about 100%; and a third first mask portion defined by an opening portion.

14. The method of claim 13, wherein the primary processing on the unprocessed bank layer comprises:

curing at least a portion of the unprocessed bank layer overlapping the third first mask portion with light passed through the third first mask portion;

curing at least a portion of the unprocessed bank layer overlapping the second first mask portion with light passed through the second first mask portion; and removing at least a portion of the unprocessed bank layer to expose at least a portion of the pixel electrode and to form the first surface, the second surface, and the third surface of the second portion of the secondary-processed bank layer.

15. The method of claim 12, wherein the second mask comprises:

a first second mask portion which blocks light; and a second second mask portion defined by an opening portion.

16. The method of claim 15, wherein the secondary processing on the primary-processed bank layer comprises:

curing at least a portion of the primary-processed bank layer overlapping the second second mask portion with light passed through the second second mask portion; and removing at least a portion of the primary-processed bank layer to make the first angle be less than a second angle between the second surface and the third surface of the second portion of the secondary-processed bank layer.

17. The method of claim 12, wherein at least a portion of the first surface is disposed above an upper surface of the third portion of the secondary-processed bank layer.

18. The method of claim 17, wherein the first surface of the second portion of the secondary-processed bank layer comprises:

a first first surface connected to the third surface of the second portion of the secondary-processed bank layer to be disposed above the upper surface of the third portion of the secondary-processed bank layer and comprising a flat surface; and a second first surface connecting the first first surface and the upper surface of the third portion of the secondary-processed bank layer to each other and comprising a curved surface.

19. The method of claim 12, further comprising:

providing a common layer on the secondary-processed bank layer, wherein a common layer disposed on the first surface of the second portion of the secondary-processed bank layer and a common layer disposed on the second surface of the second portion of the secondary-processed bank layer are spaced apart from each other.

20. The method of claim 19, further comprising:

providing an encapsulation layer on the common layer, wherein the encapsulation layer is in contact with the third surface.

* * * * *